United States Patent
Pelliccione et al.

(10) Patent No.: US 11,846,685 B1
(45) Date of Patent: Dec. 19, 2023

(54) LORENTZ FORCE VELOCITY SENSOR SYSTEM

(71) Applicant: The Boeing Company, Chicago, IL (US)

(72) Inventors: Matthew J. Pelliccione, Malibu, CA (US); Danny M. Kim, Malibu, CA (US); Travis M. Autry, Calabasas, CA (US); Rongsheng Li, Menifee, CA (US); Brian C. Grubel, Herndon, VA (US); James H. Kober, Herndon, VA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 17/814,452

(22) Filed: Jul. 22, 2022

(51) Int. Cl.
    *G01R 33/00* (2006.01)
    *G01P 3/50* (2006.01)

(52) U.S. Cl.
    CPC ............ *G01R 33/0017* (2013.01); *G01P 3/50* (2013.01)

(58) Field of Classification Search
    CPC ... G01R 33/0017; G01P 3/50; H01L 29/7869; H01L 27/12; H01L 27/1266; H01L 27/1255; H01L 27/124; H01L 27/14636; H01L 27/14696; H01L 27/14634; H01L 27/14632; H01L 29/78648; H01L 27/14641; G06F 13/00
See application file for complete search history.

(56) References Cited

U.S. PATENT DOCUMENTS

| | | | |
|---|---|---|---|
| 9,018,944 B2 | 4/2015 | Mol | |
| 9,243,915 B2 | 1/2016 | Hernandez et al. | |
| 9,810,551 B2 | 11/2017 | Ausserlechner | |
| 2006/0033664 A1* | 2/2006 | Soler Castany | H01L 23/66 343/895 |
| 2009/0189064 A1* | 7/2009 | Miller | G01N 27/624 250/281 |
| 2013/0009905 A1* | 1/2013 | Castillo | G06F 3/0414 345/174 |
| 2015/0106008 A1* | 4/2015 | Hernandez | G01C 21/183 701/408 |
| 2016/0290830 A1 | 10/2016 | Friedrich et al. | |
| 2017/0199024 A1* | 7/2017 | Georgeson | G01S 5/16 |

OTHER PUBLICATIONS

Mondal et al., "Field-effect-induced two-dimensionalelectrongasutilizingmodulation-doped ohmiccontacts," Science Direct, Aug. 20, 2014, Solid State Communications, vol. 197, pp. 20-24.

* cited by examiner

*Primary Examiner* — Alvaro E Fortich
(74) *Attorney, Agent, or Firm* — Yee & Associates, P.C.

(57) ABSTRACT

A system, apparatus, and method for determining a velocity. A voltage is detected for a planar sensor array while the planar sensor array is moving though a magnetic field, wherein the planar sensor array comprises conductive channels formed in a substrate, wherein the conductive channels are connected in series, and wherein the voltage is generated by the planar sensor array in response to a movement of the planar sensor array through the magnetic field and wherein the voltage is proportional to a velocity of the planar sensor array moving through the magnetic field. The velocity of the planar sensor array is determined using the voltage detected for the conductive channels.

24 Claims, 13 Drawing Sheets

LORENTZ FORCE VELOCITY SENSOR SYSTEM

BACKGROUND INFORMATION

1. Field

The present disclosure relates generally to sensor systems for determining velocity and in particular, to velocity sensor systems for detecting the velocity of a platform moving through the Earth's magnetic field.

2. Background

The velocity of a vehicle moving through an environment can be used for navigation of vehicle. A number of different mechanisms are present for determining the velocity of a vehicle. For example, the velocity can be determined using active environment problem. This type of technique can involve using radio frequency excitation in radar systems, global positioning system (GPS) devices, sonar systems, or other systems can be used to determine the velocity of a vehicle.

The timing signals transmitted by global positioning system satellites and other satellite navigation systems are quite weak in reaching the ground. As result, these types of signals can be easily disrupted by inadvertent or intentional interference.

Further, global positioning system signals are practically unavailable for subsea environments. Additionally, the use of other active systems such as radar or sonar can also be undesirable for some subsea missions.

With a subsea or underwater environment, other navigation systems can be used. For example, an inertial navigation system can be used to determine the velocity of a vehicle operating underwater. An inertial navigation system is a navigation device that uses motion sensors such as accelerometers and rotation sensors such as gyroscopes to calculate by dead reckoning the position, orientation, and velocity of a vehicle. An inertial measurement system, however, uses an independent measurement of velocity or time and position to correct for drift errors due to the integrations used to extract position data from the accelerations measured.

Therefore, it would be desirable to have a system, method, and apparatus that take into account at least some of the issues discussed above, as well as other possible issues. For example, it would be desirable to have a system, method, and apparatus that overcome an issue with measuring the velocity of a moving vehicle.

SUMMARY

An embodiment of the present disclosure provides a navigation system that comprises a substrate, wherein the substrate is planar. The conductive channels are formed in the substrate. The conductive channels are connected in series to form a planar sensor array and wherein a voltage is generated by the planar sensor array in response to a movement of the planar sensor array through a magnetic field. The voltage is proportional to a velocity of the planar sensor array moving through the magnetic field.

In another embodiment of the present disclosure, a velocity sensor comprises a substrate, wherein the substrate is planar and has free charge carriers. Conductive channels are formed in the substrate. Ends for lengths of the conductive channels are grounded and sides of the conductive channels are connected in series to form a planar sensor array and wherein a voltage is generated by the planar sensor array in response to a movement of the planar sensor array through a magnetic field. The voltage is proportional to a velocity of the planar sensor array moving through the magnetic field.

In yet another embodiment of the present disclosure, a method determines a velocity. A voltage for a planar sensor array is detected while the planar sensor array is moving though a magnetic field. The planar sensor array comprises conductive channels formed in a substrate. The conductive channels are connected in series. The voltage is generated by the planar sensor array in response to a movement of the planar sensor array through the magnetic field, and the voltage is proportional to a velocity of the planar sensor array moving through the magnetic field. The velocity of the planar sensor array is determined using the voltage detected for the conductive channels.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

DETAILED DESCRIPTION

Figure 1:
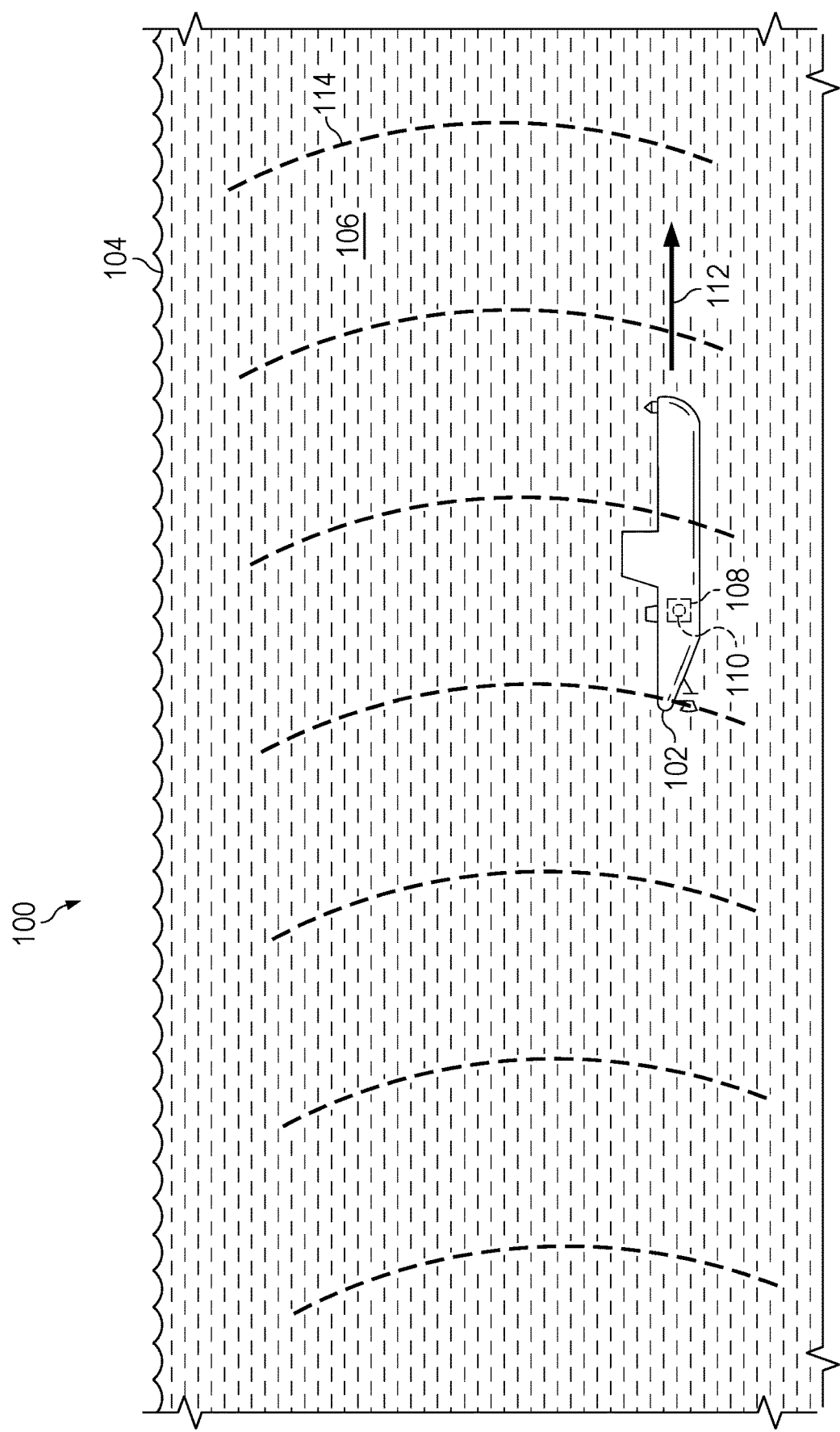
FIG. 1 is an illustration of an underwater environment in accordance with an illustrative embodiment.

The illustrative embodiments recognize and take into account one or more different considerations as described as follows. For example, one manner in which velocity can be measured for vehicles traveling underwater involves using an acoustic doppler current profiler (ADCP) or doppler velocity log (DVL). However, in very deep water, at least one of the limited range of the sensor or depth limitation of the vehicle can make such measurements infeasible.

As used herein, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

With this type of measurement system, the vehicle may need to dive closer to the seafloor to make measurements which is time and energy consuming. Using an acoustic doppler current profiler also transmits sound into the environment can allow the position of the vehicle to be determined. An alternative approach is to come to the surface and use a global positioning system device. However, surfacing may be undesirable for security concerns or mission parameters.

Another type of velocity measurement involves measuring features of the local environment such as wind or water speeds that are also relative measurements and thus inaccurate. A number of relative velocity sensors exist such as flow sensors for underwater vehicles and pitot tubes for aircraft. However, these types of sensors have a limitation in that these sensors only measure speed relative to the medium through which the vehicle is traveling.

To obtain an absolute measurement of velocity relative to Earth, the water current speed or air speed must be known a priori. This information may be unavailable in certain operational conditions or insufficient accuracy may be present to determine the velocity relative to Earth within a desired level of error, such as an error that is less than 1 mm/second.

In the illustrative example, the velocity can be determined directly using an external reference other than a global positioning system, the ocean surface, or ocean floor. Further, the illustrative examples can determine velocity without using active environment probing such as radio frequency excitation in radar systems or global position system or audible signals such as sonar.

The illustrative examples use the magnetic field of the Earth as the external reference to measure the velocity of a vehicle. The Earth's magnetic field can also be referred to as a "B-field" or "B". The magnetic field of the Earth is very low, such as on the order of 0.2 to 0.5 Gauss. Detecting Lorenz force in the magnetic fields can be challenging as the velocity of the vehicle decreases.

Further, the vehicle may need to dive closer to the seafloor to achieve such a measurement which is time and energy consuming. Using an acoustic doppler current profiler also transmits sound into the environment which may allow detection of the position of the vehicle. Thus, in some cases a particular mission may not allow active use of signals with this environment being characterized as sonar-denied.

One alternative approach is for the vehicle to surface and use a global positioning system device. However, such surfacing can create a security concern in some cases. Another approach can include measuring the water speeds. For example, relative velocity sensors such as flow sensors for underwater vehicles and pitot tubes for aircraft can be used to make relative velocity measurements. However, these techniques are also relative measurements that measure the speed relative to the medium through which the vehicle travels. To obtain an absolute measurement of velocity relative to the earth, the water current speed or airspeed needs to be known ahead of time. This information, however, may be unavailable in certain conditions for the accuracy may not be as great as desired. Thus, these techniques may not be as accurate as desired. Therefore, it would be desirable to measure velocity without being near the seafloor or the surface.

Thus, obtaining an absolute velocity involves using an external reference. For example, a global positioning system or the surface of the earth or the ocean floor. The illustrative examples recognize that another reference that can be used is the magnetic field of the earth. The magnetic field of the earth is very low. For example, the magnetic field can be from about 0.2 Gauss to about 0.5 Gauss. As result, detecting a Lorentz force in these magnetic fields at low speeds can be difficult. The detection can require sensitivity in a sub nano Newton range or less.

With reference now to the figures in particular with reference to FIG. 1, an illustration of an underwater environment is depicted in accordance with an illustrative embodiment. In underwater environment 100, submarine 102 is located below surface 104 of ocean 106.

As depicted, submarine 102 has navigation system 108 that includes velocity sensor 110. Velocity sensor 110 is located in an integrated circuit.

In this example, as submarine 102 moves in direction 112 through Earth's magnetic field 114. Velocity sensor 110 in navigation system 108 can detect the velocity of submarine 102. In this example, velocity sensor 110 is an architecture that is designed to measure the velocity of submarine 102 as submarine 102 moves through Earth's magnetic field 114. In this example, velocity sensor 110 provides a measurement of the Lorentz force exerted on free charge carriers in a semiconductor in velocity sensor 110. In this manner, velocity sensor 110 can provide an independent measurements of velocity when the Earth's magnetic field 114 is known.

With a known magnetic field at the location of velocity sensor 110, a measurement of the Lorentz force can be used to estimate the velocity of velocity sensor 110 and the velocity of submarine 102 relative to the source of the magnetic field, the earth in this example.

Figure 2:
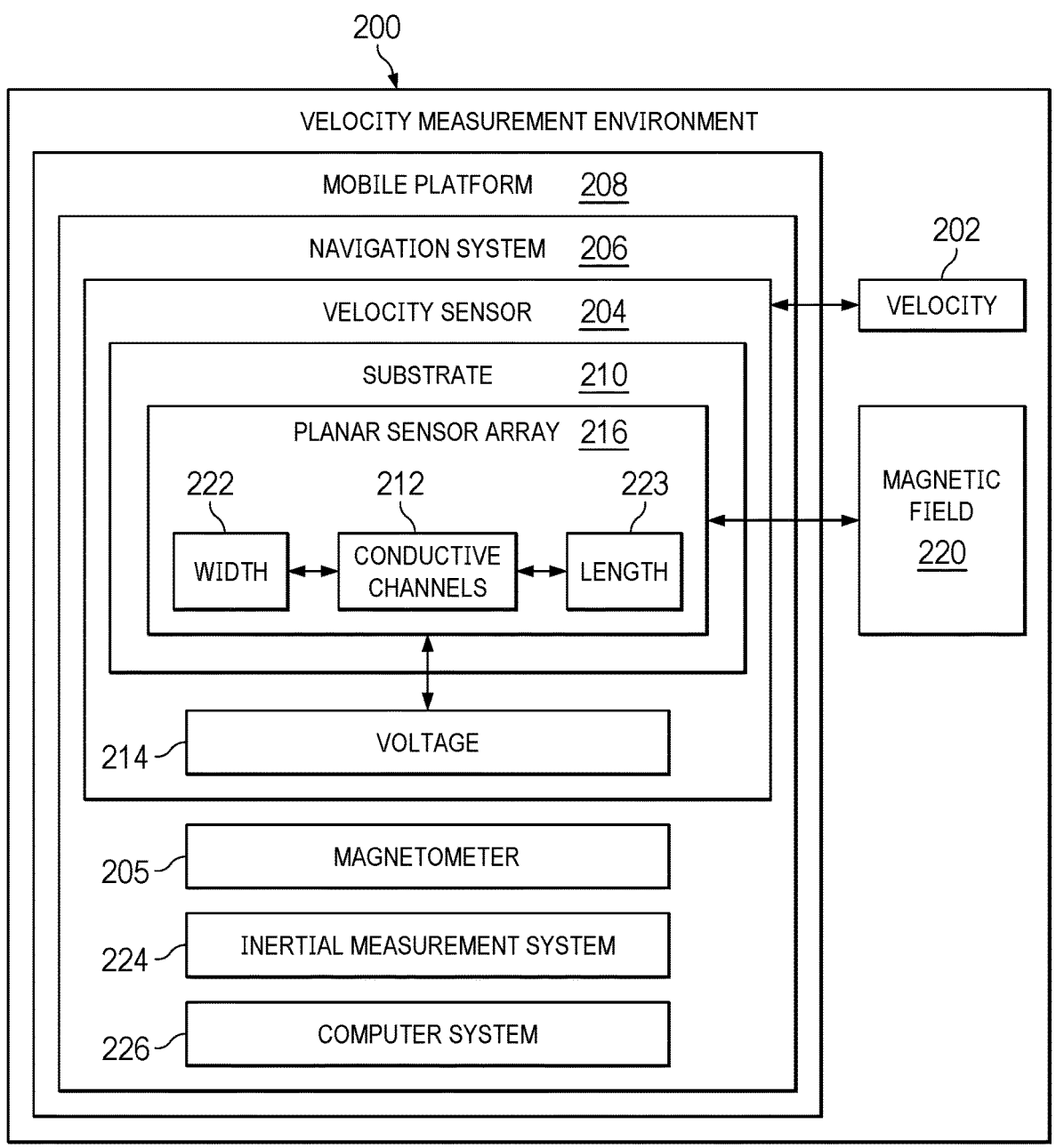
FIG. 2 is an illustration of a velocity measurement environment in accordance with an illustrative embodiment.

With reference next to FIG. 2, an illustration of a velocity measurement environment is depicted in accordance with an illustrative embodiment. In this illustrative example, velocity measurement environment 200 is an environment in which velocity 202 can be measured for velocity sensor 204 in navigation system 206. In this example, navigation system 206 with velocity sensor 204 is located in mobile platform 208. As result, velocity 202 of mobile platform 208 can be determined.

In this illustrative example, mobile platform 208 can take a number of different forms. For example, mobile platform 208 can be selected from a group comprising a vehicle, a mobile underwater vehicle, a submarine, a submersible vehicle, an autonomous underwater vehicle, an underwater drone, an underwater remotely operated vehicle, an aircraft, a commercial airplane, a tilt-rotor aircraft, a tilt wing aircraft, a vertical takeoff and landing aircraft, an electrical vertical takeoff and landing vehicle, a personal air vehicle, a missile, a surface ship, a boat, a tank, a personnel carrier, a train, a spacecraft, a satellite, a bus, a space station, and an automobile. In these illustrative examples, mobile platform 208 can be powered or unpowered. In other words, mobile platform 208 may not have a propulsion system and may rely on other sources for movement. For example, mobile platform 208 can move by being pulled or pushed by a vehicle or can move within a current when mobile platform 208 is located underwater.

In this illustrative example, velocity sensor 204 comprises substrate 210 and conductive channels 212. Substrate 210 is planar. Substrate 210 can take a number of different forms. For example, substrate 210 can be one of one of a semiconductor, silicon, a category III-V compound, a silicon on insulator wafer, indium arsenide, gallium nitride, gallium arsenide and other suitable substrates. The particular material in materials in substrate 210 can be selected based on electron mobility. As electron mobility increases, lower noise such as Johnson noise occurs. The increased mobility can be present when there is less resistance to charges moving within substrate 210. In this illustrative example, substrate 210 can have a physical form such as a wafer. The wafer can take various sizes including a 4 inch wafer, a 6 inch wafer, an 8 inch wafer, and a 12 inch wafer.

For example, gallium arsenide has less resistance to charge movement then silicon. With less noise, voltage 214 and changes in voltage 214 are easier to detect. In this depicted example, substrate 210 can be comprised of a semiconductor or other material having a room temperature mobility of at least 1,000 cm2/V*s.

In this illustrative example, conductive channels 212 are formed in substrate 210. Conductive channels 212 are connected in series to form planar sensor array 216. Voltage 214 is generated by planar sensor array 216 in response to movement of planar sensor array 216 through magnetic field 220. In this example, current is not applied to conductive channels 212. Instead, a current can be generated in response to movement of the conductive channels through magnetic field 220. Magnetic field 220 can cause movement of charges in conductive channels 212 in response to movement of conductive channels 212 through magnetic field 220. This current can then be measured as voltage 214.

Voltage 214 is proportional to velocity 202 of planar sensor array 216 moving through magnetic field 220. In this illustrative example, velocity is calculated as follows:

$$v = V/NWB$$

where v is velocity 202, N is a number of conductive channels 212 in conductive channels 212, W is width 222 of conductive channels 212, B is magnetic field 220, and V is voltage 214. In this illustrative example, magnetic field 220 is the magnetic field 220 at the location of velocity sensor 204. Magnetic field 220 is a vector field having a magnitude and direction. In this illustrative example, magnetic field 220 is measured as magnetic flux density (B). Magnetic field 220 can be a magnetic field generated by any source relative to velocity sensor 204 in mobile platform 208.

In this example, magnetic field 220 can be measured using magnetometer 205 in navigation system 206. In this example, magnetometer 205 can be implemented using, for example, a fluxgate magnetometer, a spin exchange relaxation-free (SERF) magnetometer, and proton magnetometer.

In this illustrative example, each conductive channel in conductive channels 212 have width 222 and length 223. Length 223 can be ignored in determining velocity in some circumstances. For example, length 223 for each of conductive channels 212 can have a value where length 223 has no effect on voltage 214 measured across conductive channels 212. In other words, the length 223 can be very long as compared to width 222 such that length 223 has no effect on the measurement of voltage 214.

In this illustrative example, magnetic field 220 can take a number of different forms. For example, magnetic field 220 can be Earth's magnetic field 114 in in FIG. 1. As another example, magnetic field 220 can be generated by another planet, the moon, or a beacon. For example, when mobile platform 208 is a spacecraft traveling relative to another planet, such as Mars, magnetic field 220 can be the Earth's magnetic field. A magnetic beacon can be placed underwater, on land, or other locations to generate magnetic field 220.

Thus, velocity 202 can be determined for mobile platform 208 with velocity sensor 204 in navigation system 206 located in mobile platform 208. Further, velocity 202 as determined using velocity sensor 204 can be used to update other components in navigation system 206. For example, velocity 202 measured using planar sensor array 216 can be used to correct errors in measurements in inertial measurement system 224 in navigation system 206.

In this illustrative example, computer system 226 can be present in navigation system 206. Computer system 226 can perform navigations functions using velocity sensor 204, inertial measurement system 224, and other sensors or components within navigation system 206. For example, the correction of errors in inertial measurement system 224 using velocity 202 determined using velocity sensor 204 can be performed by computer system 226.

Computer system 226 is a physical hardware system and includes one or more data processing systems. When more than one data processing system is present in computer system 226, those data processing systems are in communication with each other using a communications medium such as a network. The data processing systems can be selected from at least one of a computer, a server computer, a tablet computer, or some other suitable data processing system in navigation system 206.

As depicted, computer system 226 includes a number of processor units that are capable of executing program instructions implementing processes in the illustrative examples. As used herein a processor unit in the number of processor units is a hardware device and is comprised of hardware circuits such as those on an integrated circuit that respond and process instructions and program code that operate a computer.

Figure 3:
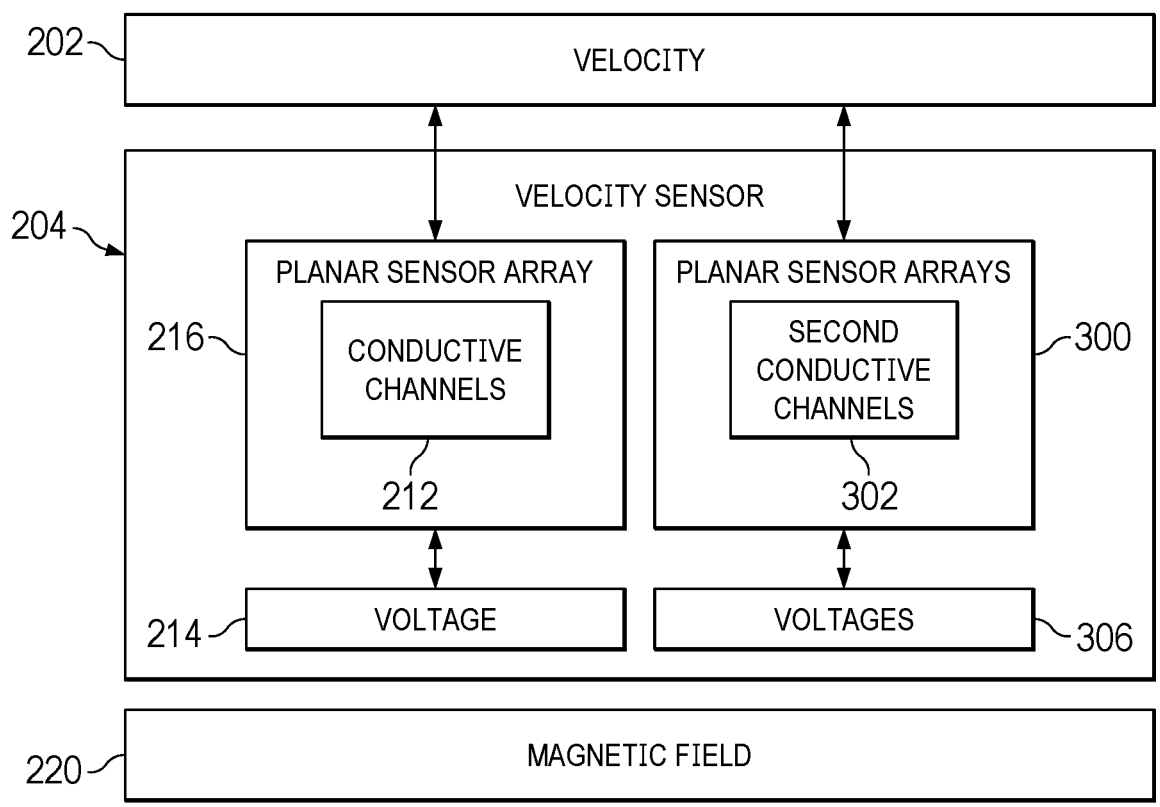
FIG. 3 is an illustration of a block diagram of a velocity sensor in accordance with an illustrative embodiment.

With reference now to FIG. 3, an illustration of a block diagram of a velocity sensor is depicted in accordance with an illustrative embodiment. In the illustrative examples, the same reference numeral may be used in more than one figure. This reuse of a reference numeral in different figures represents the same element in the different figures.

In this illustrative example, velocity sensor 204 is comprised of planar sensor array 216 and a set of planar sensor arrays 300. As used herein, a set of when used with reference to items means one or more items. For example, a set of planar sensor arrays 300 is one or more planar sensor arrays 300.

As depicted, second conductive channels 302 form the set of planar sensor arrays 300. As depicted, second conductive channels 302 generate a set of voltages 306 in response to a movement of the set of planar sensor arrays 300 through magnetic field 220. In this illustrative example, the set of voltages 306 is proportional to velocity 202 of the set of planar sensor arrays 300 moving through magnetic field 220.

In this illustrative example, planar sensor array 216 and the set of planar sensor arrays 300 are positioned relative to each other. This position can be selected to increase the ability to detect velocity 202 for different orientations of velocity sensor 204 in relation to magnetic field 220.

In one illustrative example, planar sensor array 216 and the set of planar sensor arrays 300 can be orthogonal to each other. These planar sensor arrays can be positioned at right angles or perpendicular to each other. In other words, a first plane on which planar sensor array 216 is located can be perpendicular to a second plane on which a second planar sensor array in the set of planar sensor arrays 300 is located.

Figure 4:
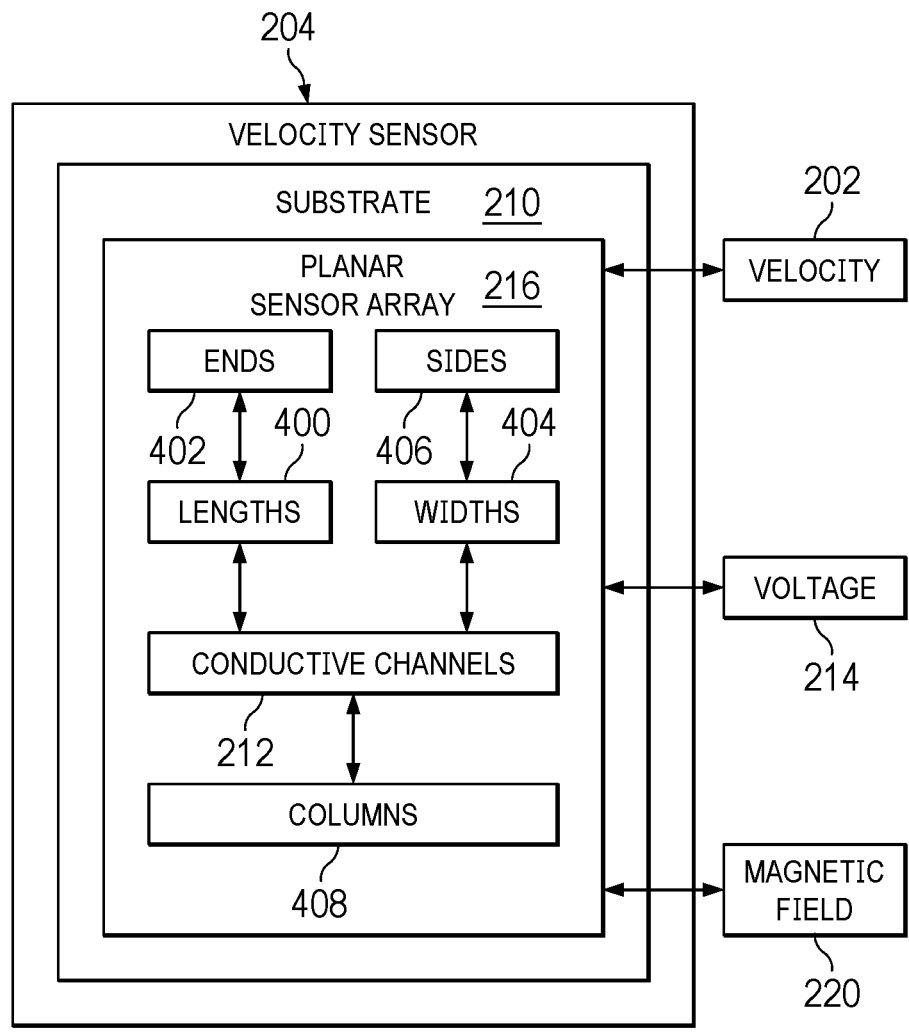
FIG. 4 is an illustration of a block diagram of a velocity sensor with an illustrative embodiment.

Turning to FIG. 4, an illustration of a block diagram of a velocity sensor is depicted with an illustrative embodiment. In this illustrative example, a more detailed block diagram of velocity sensor 204 is shown. As depicted, conductive channels 212 are formed in substrate 210, which is planar. In this example, conductive channels 212 form planar sensor array 216.

As depicted, conductive channels 212 have lengths 400 with ends 402 that are grounded. Conductive channels 212 also have widths 404 with sides 406. In this example, sides 406 are connected in series. In other words, one side for a conductive channel is connected to another side for another conductive channel.

In this illustrative example, the connection of conductive channels 212 are physically arranged in substrate 210 as a set of columns 408 of conductive channels 212 in substrate 210. Conductive channels 212 in each column in the set of columns 408 are connected in series to each other. Each column in the set of columns 408 are also connected in series with each other.

With this configuration, voltage 214 is generated by planar sensor array 216 in response to movement of planar sensor array 216 through magnetic field 220. Voltage 214 generated by planar sensor array 216 in velocity sensor 204 is proportional to velocity 202 of planar sensor array 216 moving through magnetic field 220.

Figure 5:
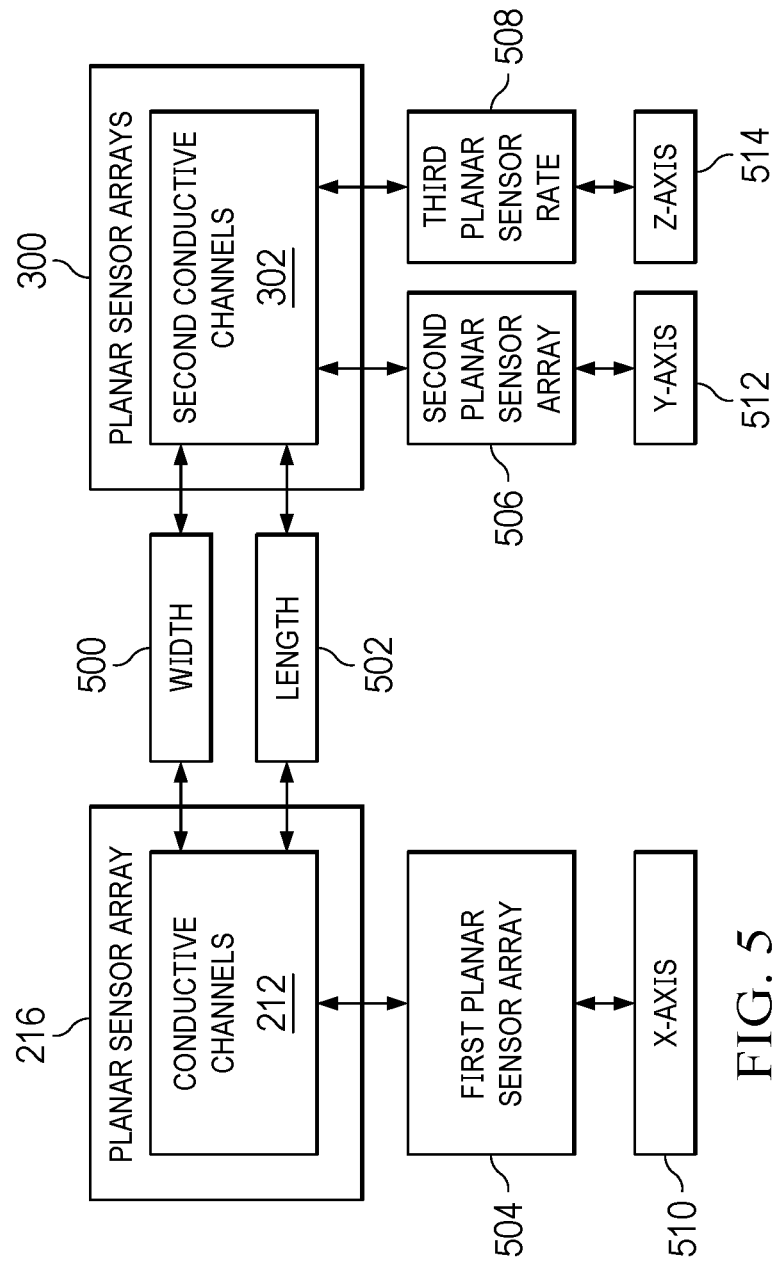
FIG. 5 is an illustration of a block diagram of a configuration of planar sensor arrays in accordance with an illustrative embodiment.

With reference next to FIG. 5, an illustration of a block diagram of a configuration of planar sensor arrays is depicted in accordance with an illustrative embodiment. In this illustrative example, each of conductive channels 212 and second conductive channels 302 have width 500 and length 502.

In this example, planar sensor array 216 is first planar sensor array 504. The set of planar sensor arrays 300 comprises second planar sensor array 506 and third planar sensor array 508.

Length 502 of conductive channels 212 in first planar sensor array 504 are aligned with x-axis 510. Length 502 of second conductive channels 302 in second planar sensor array 506 are aligned with y-axis 512, and length 502 of second conductive channels 302 in third planar sensor array 508 are aligned with z-axis 514. In this example, these three axes are orthogonal to each other. These axes are Cartesian axes in this example and can also be characterized as being perpendicular to each other.

Figure 6:
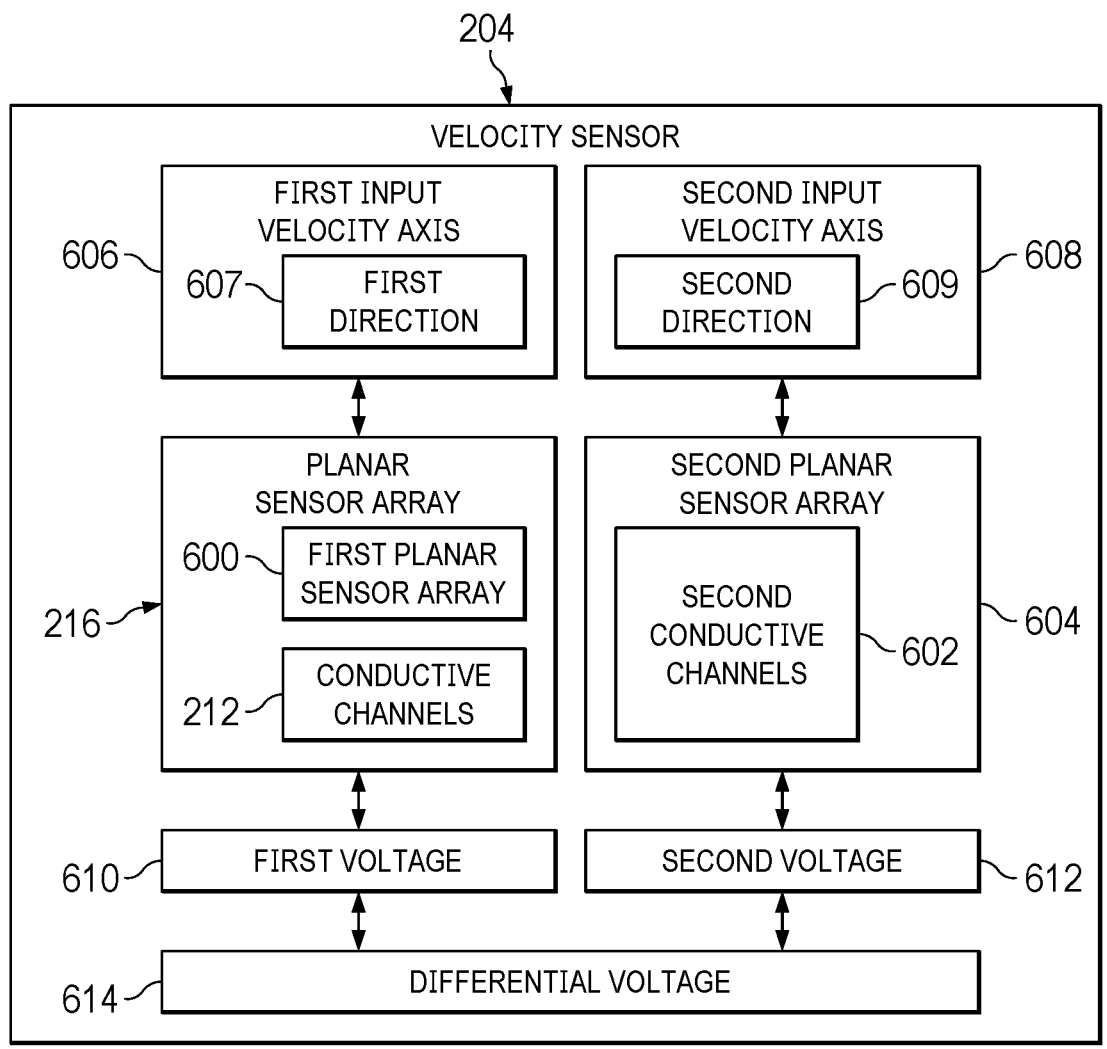
FIG. 6 is an illustration of a block diagram of a velocity sensor with common mode rejection in accordance with an illustrative example.

In FIG. 6, an illustration of a block diagram of a velocity sensor with common mode node rejection is depicted in accordance with an illustrative example. In this illustrative example, velocity sensor 204 can be configured to provide common mode noise rejection.

As depicted, planar sensor array 216 with conductive channels 212 is first planar sensor array 600 Velocity sensor 204 also has second conductive channels 602 for second planar sensor array 604.

In this example, first planar sensor array 600 has first input velocity axis 606 in first direction 607. Second planar sensor array 604 has second input velocity axis 608 in second direction 609. Second input velocity axis 608 in second direction 609 is opposite of first input velocity axis 606 in first direction 607. The input velocity axis is the axis of maximum sensitivity to detecting velocity. The input can be in a first direction and a second direction alone the input velocity axis. The first direction and second direction are opposite to each other.

In this illustrative example, the input velocity axis is relative to the direction of the magnetic field. By having an input axis in the opposite direction, the inputs are flipped or change such that the voltage measurement is of the opposite sign.

This type of connection for measuring voltages results in first voltage 610 measured for first planar sensor array 600 having an opposite sign to second voltage 612 measured for second planar sensor array 604. In other words, the connections are such that first voltage 610 and second voltage 612 have opposite signs.

In this example, differential voltage 614 can be obtained by adding first voltage 610 and second voltage 612. In this illustrative example, differential voltage 614 between first planar sensor array and the second planar sensor array is proportional to velocity 202 and rejects source of bias noise that affects both first planar sensor array 600 and the second planar sensor array 604 at a same time.

In one illustrative example, one or more solutions are present that overcome a problem with measuring velocity. The illustrative example, one or more solutions is present for measuring velocity without using active signals or probing to determine velocity. In the illustrative example, an external reference in the form of a magnetic field is used. The measurement of the magnetic field can be measured even though the magnetic field can be very low such as 0.2 to 0.5 Gauss. In the illustrative example, a solution involves using free charge carriers in a semiconductor that measures a voltage recurring from a Lorentz force exerted on the free charge carriers in the semiconductor in response to movement through the magnetic field. The solution does not require mechanical or moving parts. Instead, the measurements can be made to voltages measured on a semiconductor. The semiconductor can be implemented in an integrated chip for use in a navigation system.

In one example implementation, velocity sensor 204 can be implemented using an array of 1000 conductive sensors that are 50 microns wide and 250 microns long fabricated on 100 micron thick silicon-on-insulator (SOI) substrate. In this example, a signal-to-noise ratio (SNR) of 1 at 50 mm/s velocity can be achieved. This signal-to-noise ratio assumes input noise voltage is limited by chopper stabilized op-amps for high DC performance. Signal-to-noise ratio scales as sqrt(N) in this limit, so a signal-to-noise ratio of 1 can be achieved at 5 mm/s with an array of 100,000 conductive channels. In one example, about 300,000 conductive channels can be formed in or on a semiconductor in the form of a 4 inch wafer, taking into account ohmic contact and trace overhead area.

The size of the velocity sensor can be dominated by the total area of sensors required to achieve desired signal-to-noise ratio, along with a companion magnetometer to measure the magnetic field. A 4 inch or a 6 inch wafer can be packed with devices, which would set a lower bound on the sensor packaging size. In an example implementation, power and electronics are fit in a package of similar linear dimension.

The illustration of navigation system 206 in velocity measurement environment 200 and the different components depicted in FIGS. 2-6 is not meant to imply physical or architectural limitations to the manner in which an illustrative embodiment may be implemented. Other components in addition to or in place of the ones illustrated may be used. Some components may be unnecessary. Also, the blocks are presented to illustrate some functional components. One or more of these blocks may be combined, divided, or combined and divided into different blocks when implemented in an illustrative embodiment.

For example, although magnetometer 205 is shown as a separate functional component from velocity sensor 204, these two functional components can be implemented in or on a wafer as single physical component. As another example, the different planar sensor arrays can be formed on the same substrate or different substrates. When the planar sensor arrays are positioned orthogonally, different substrates can be used.

Figure 7:
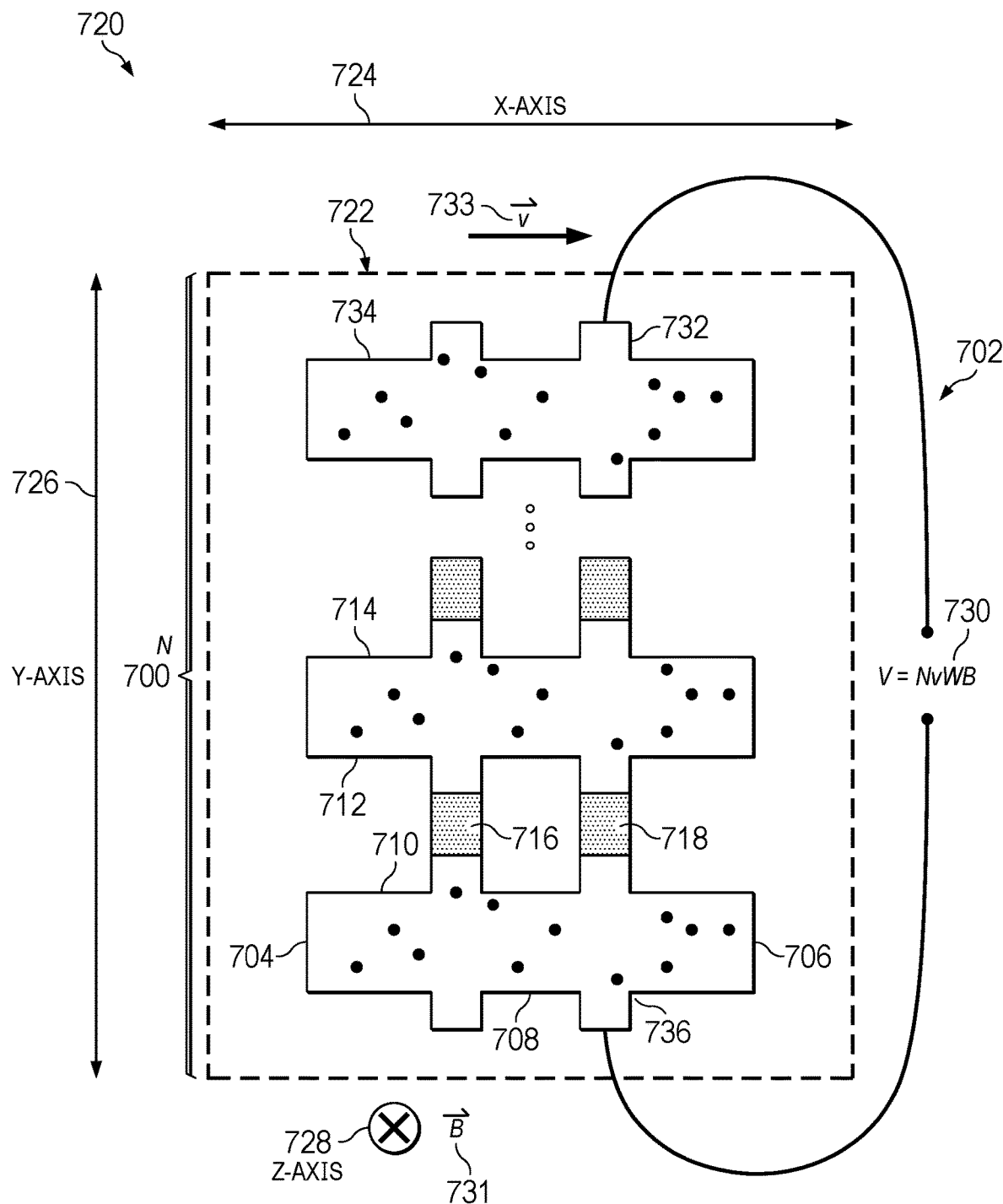
FIG. 7 is an illustration of conductive channels defined in a semiconductor in accordance with an illustrative embodiment.

Turning next to FIG. 7, an illustration of conductive channels defined in a semiconductor is depicted in accordance with an illustrative embodiment. In this illustrative example, conductive channels 700 are located in semiconductor 702. Conductive channels 700 in semiconductor 702 contain free charge carriers such as electrons or holes.

In this illustrative example, the ends of conductive channels 700 are grounded. For example, end 704 and end 706 for conductive channel 708 are grounded.

As depicted, conductive channels 700 have sides connected to each other in series using ohmic contacts. For example, side 710 of conductive channel 708 is connected to side 712 of conductive channels 714 using ohmic contact 716 and ohmic contact 718.

In this illustrative example, conductive channels 700 are arranged in column 720 and form planar sensor array 722. As depicted, planar sensor array 722 lies on a plane defined by x-axis 724 and y-axis 726. Z-axis 728 is perpendicular to x-axis 724 and y-axis 726.

In this illustrative example, planar sensor array 722 moves with velocity 733 parallel to x-axis 724. As depicted, magnetic field 731 is known and is in a direction along the z-axis 728.

As depicted V 730 is the voltage across conductive channels 700 connected in series to each other. In this example, the voltage is measured across side 732 of conductive channel 734 and side 736 of conductive channel 708. In this example, V=NvWB, where V is V 730, N is the number of conductive channels 700 in planar sensor array 722, v is velocity 733, W is a width of a conductive channel, and B is magnetic field 731. In this example, the equation for V is a scalar equation that assumes that the magnetic field is in or out of plane of the device. With this example, V is the magnitude of the velocity.

In this illustrative example, column 720 of conductive channels 700 are connected in series to form planar sensor array 722, allows voltage V 730 to accumulate over planar sensor array 722. With N number of conductive channels 700, the noise in the measurement of V 730 can be limited by the input voltage noise of the differential amplifier, input offset drift of the amplifier, and thermoelectric noise at the metal/semiconductor junctions. Thermal stabilization of planar sensor array 722 and electronics to less than 0.01 C can be made to avoid DC drift effects that would otherwise overwhelm the velocity signal, voltage V 730.

As the N for the number of conductive channels 700 increases, the noise begins to scale as sqrt(N) because of the nonzero channel resistance of each conductive channel, which yields Johnson noise that adds in quadrature. Using a high mobility semiconductor such as InAs or GaAs with room temperature mobilities on the order of 10,000 cm2/(V*s) can avoid the channel resistance that creates a Johnson noise voltage that obscures the velocity signal. Higher conductivity channels can yield less Johnson noise. Johnson noise is also referred to as Johnson-Nyquist noise, thermal noise, or Nyquist noise and is the electronic noise generated by the thermal agitation of the charge carriers, such as the electrons, inside an electrical conductor at equilibrium, which happens regardless of any applied voltage.

Figure 8:
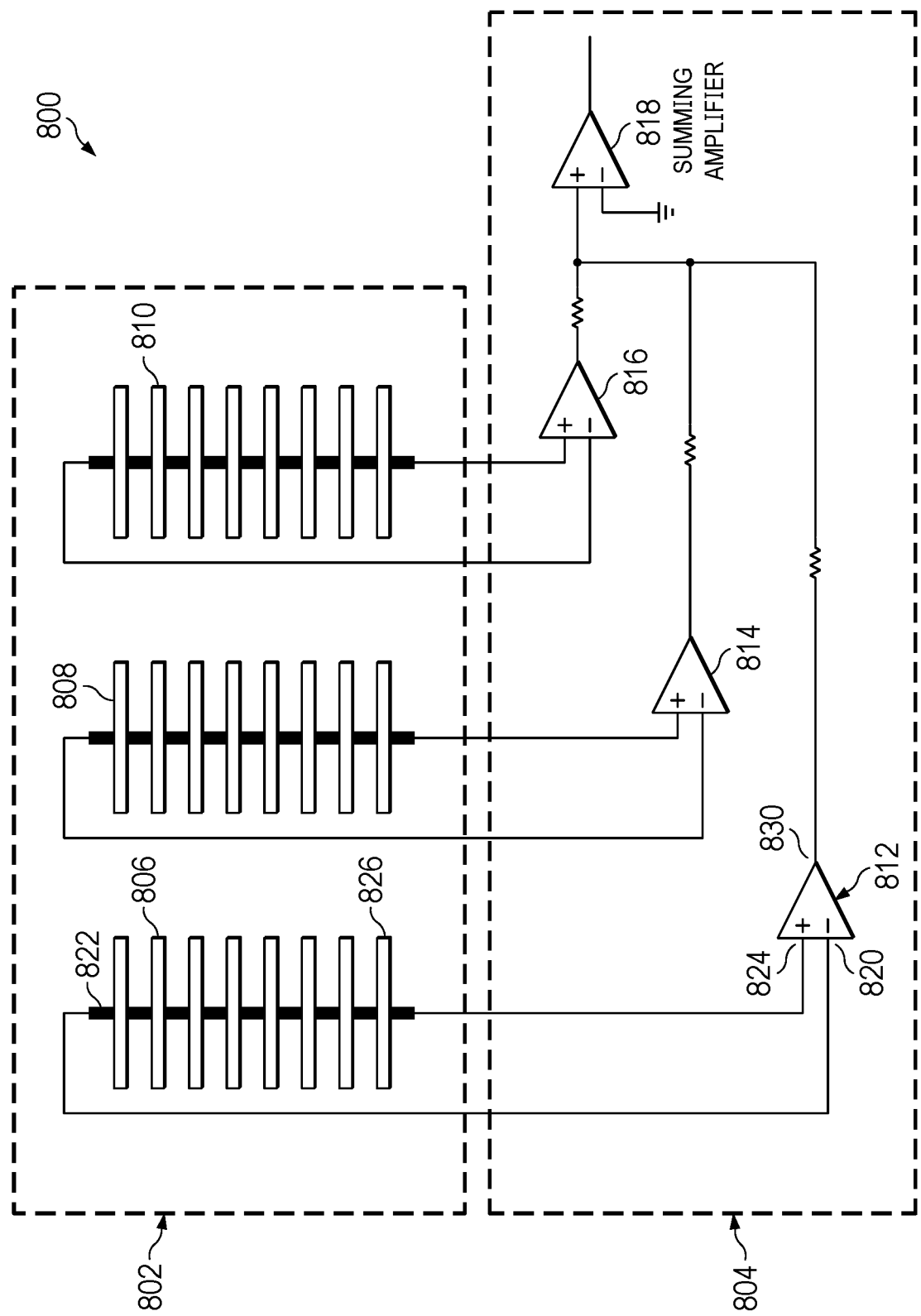
FIG. 8 is an illustration of a readout array in accordance with an illustrative embodiment.

Turning now to FIG. 8, an illustration of a readout array is depicted in accordance with an illustrative embodiment. In this illustrative example, velocity sensor 800 is an example of an implementation for velocity sensor 204 in FIG. 2 to generate a voltage that is proportional to the velocity. Velocity sensor 800 comprises planar sensor array 802 and amplifier output 804. Planar sensor array 802 is an example of an implementation for planar sensor array 216 shown in block form in FIG. 2. As depicted, planar sensor array 802 comprises columns of conductive channels connected in series. In this example, planar sensor array 802 comprises first column 806, second column 808, and third column 810.

In this example, each column is connected to amplifier output 804. As depicted, each column is connected to a differential voltage amplifier. First column 806 is connected to differential voltage amplifier 812, second column 808 is connected to differential voltage amplifier 814, and third column 810 is connected to differential voltage amplifier 816.

The differential amplifiers in amplifier output 804 are connected to the columns of the conductive channels. Each differential amplifier in the differential amplifiers has a first input connected to a first conductive channel in a column and a second input connected to a last conductive channel in the column.

For example, differential amplifier 812 has first input 820 connected to first conductive channel 822 in first column 806. Differential amplifier 812 has second input 824 connected to last conductive channel 826 in first column 806. Differential voltage amplifier 812 outputs a difference between a first voltage at first conductive channel 822 and a second voltage and last conductive channel 826 at output 830.

In this example, these differential voltage amplifiers each output differential voltage. The differential voltage output from these differential amplifiers is sent to summing amplifier 818 that outputs a voltage that is proportional to the velocity at which velocity sensor 800 moves through a magnetic field.

Figure 9:
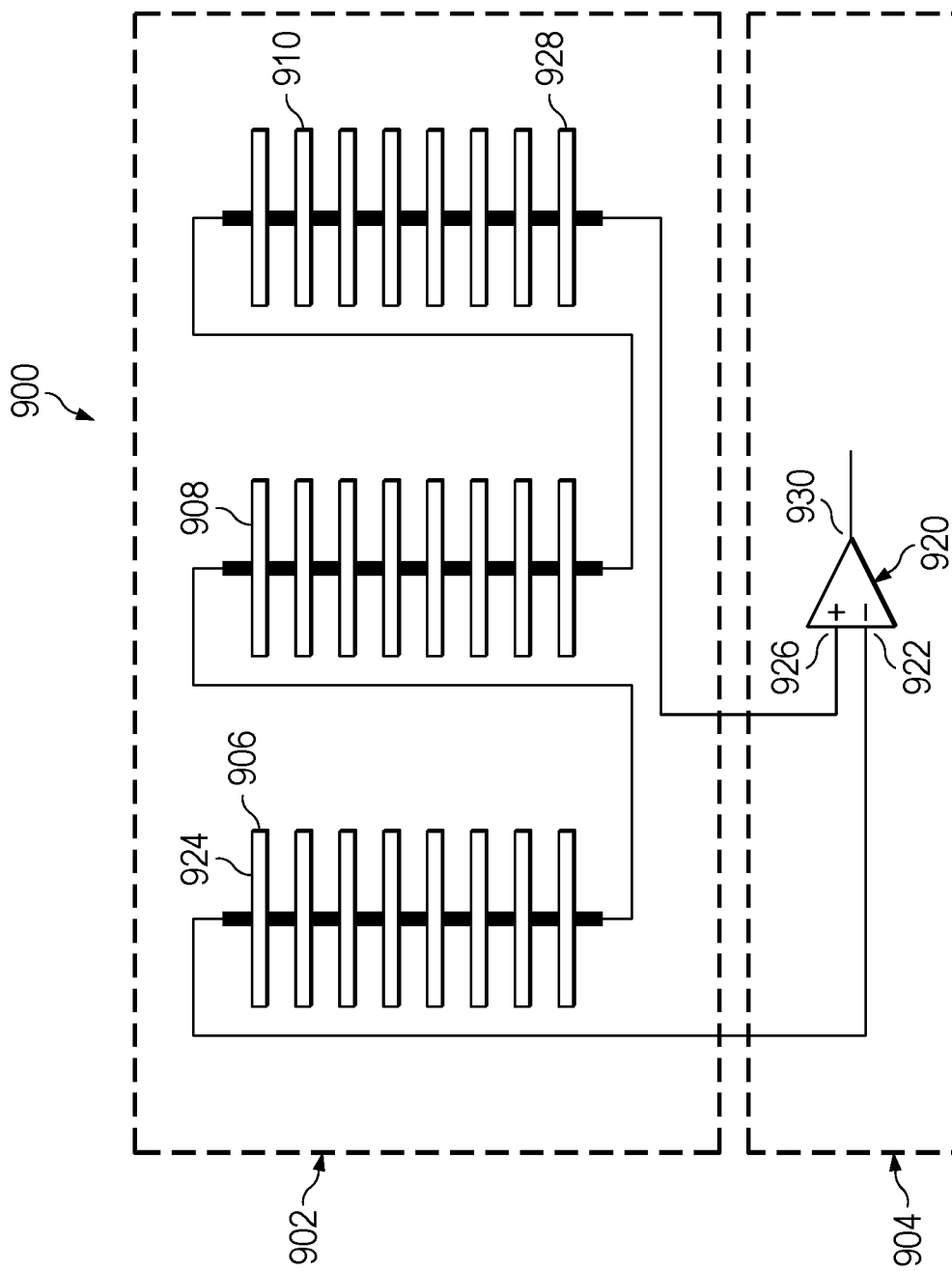
FIG. 9 is an illustration of a readout array in accordance with an illustrative embodiment.

Turning now to FIG. 9, an illustration of a readout array is depicted in accordance with an illustrative embodiment. In this illustrative example, velocity sensor 900 is an example of an implementation for velocity sensor 204 in FIG. 2 to generate a voltage that is proportional to the velocity. Velocity sensor 900 comprises planar sensor array 902 and amplifier output 904. Planar sensor array 902 is an example of an implementation for planar sensor array 216 shown in block form in FIG. 2. As depicted, planar sensor array 902 comprises columns of conductive channels connected in series. In this example, planar sensor array 902 comprises first column 906, second column 908, and third column 910.

As depicted, adjacent columns are daisy chained to each other. In other words, the columns are connected in series. In this example, differential amplifier 920 in amplifier output 904 has first input 922 connected to first conductive channel 924 in first column 906 and a second input 926 connected to last conductive channel 928 in a last column, third column 910. Differential amplifier 920 has output 930 that outputs a difference between a first voltage at first conductive channel 924 and a second voltage at last conductive channel 928.

Figure 10:
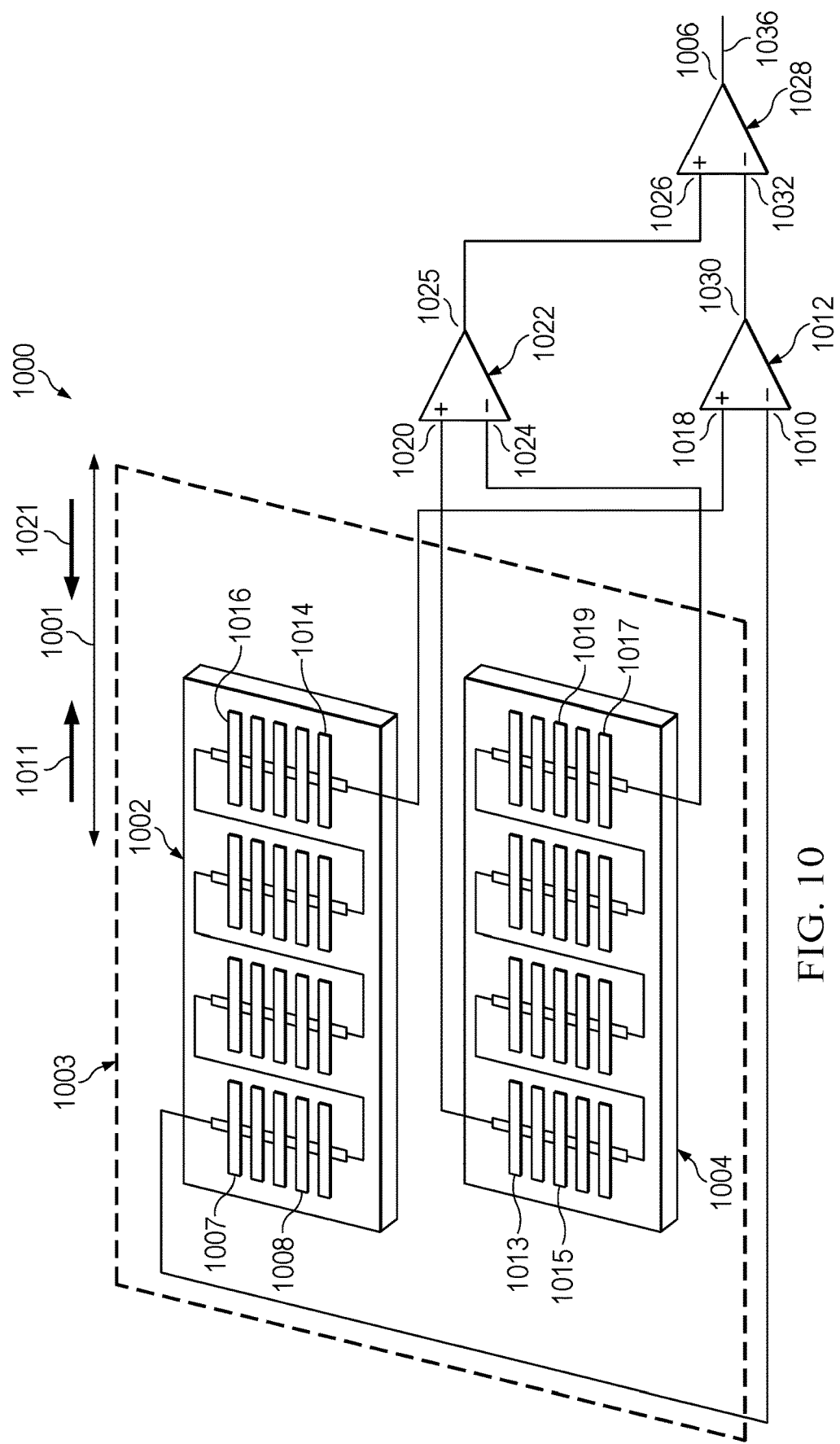
FIG. 10 is an illustration of a differential readout array in accordance with an illustrative embodiment.

With reference now to FIG. 10, an illustration of a differential readout array is depicted in accordance with an illustrative embodiment. In this illustrative example, velocity sensor 1000 is an example of an implementation for velocity sensor 204 in FIG. 2 to generate a voltage that is proportional to the velocity. As depicted, velocity sensor 1000 comprises first planar sensor array 1002, second planar sensor array 1004 and amplifier output 1006.

As depicted, first planar sensor array 1002 and second planar sensor array 1004 are examples of an implementation for planar sensor array 216 shown in block form in FIG. 2.

In this illustrative example, first planar sensor array 1002 has an input axis that is positive while second planar sensor array 1004 has an input axis that is negative.

In this illustrative example, conductive channels in first planar sensor array 1002 lie on plane 1003. Axis 1001 is aligned with the length of the conductive channels in first planar sensor array 1002 and extends through plane 1003 to form an input axis. Axis 1001 is the axis along the direction of the velocity that is measured.

For example, first conductive channel 1007 in first column 1008 in first planar sensor array 1002 is connected to negative input 1010 in differential amplifier 1012. Last conductive channel 1014 in last column 1016 is connected to positive input 1018 in differential amplifier 1012. This connection is for a positive input axis in direction 1011 along axis 1001.

With this example, first conductive channel 1013 in first column 1015 in second planar sensor array 1004 is connected to positive input 1020 in differential amplifier 1022. Last conductive channel 1017 in last column 1019 in second planar sensor array 1004 is connected to negative input 1024 in differential amplifier 1022. This connection is for a negative input axis in direction 1021 along axis 1001. The difference in the input axes result from the difference in the manner in which the positive and negative inputs to the differential amplifiers are connected.

Output 1025 from differential amplifier 1022 is connected to positive input 1026 for differential amplifier 1028. Output 1030 from differential amplifier 1012 is connected to negative input 1032 for differential amplifier 1028. Output 1036 outputs a voltage that is proportional to velocity and rejects sources of bias noise that affect both sensors simultaneously. As result, long-term stability of velocity sensor 1000 can be improved.

Figure 11:
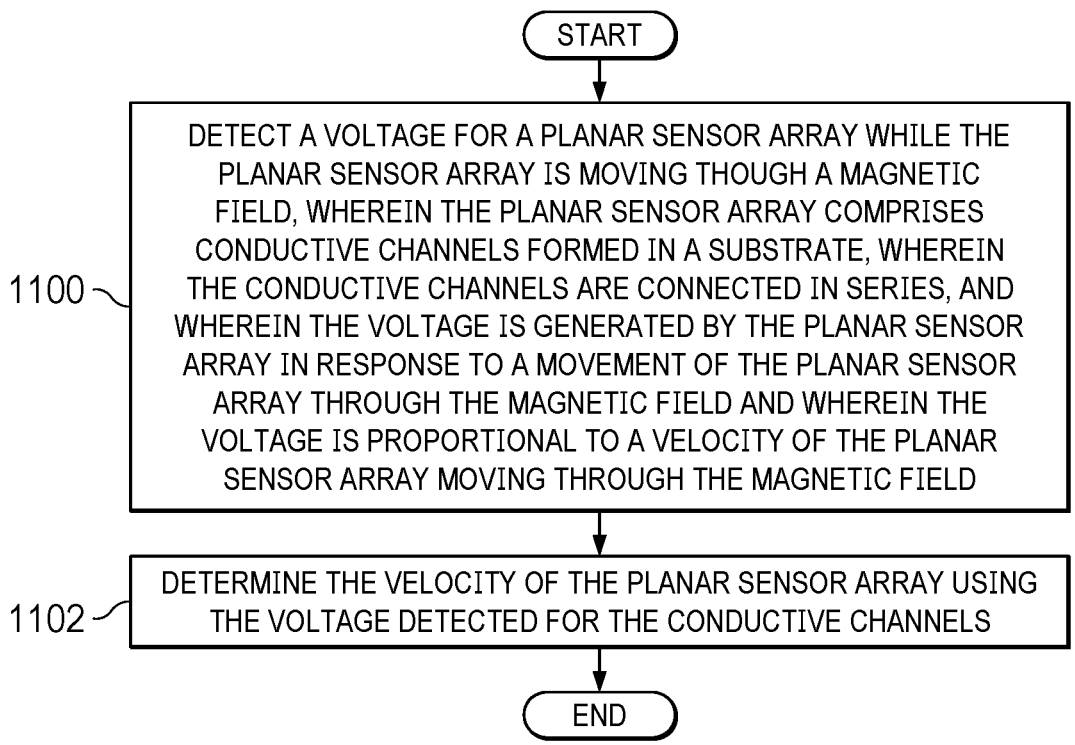
FIG. 11 is an illustration of a flowchart of a process for detecting a voltage for a planar sensor array in accordance with an illustrative embodiment.

With reference to FIG. 11, an illustration of a flowchart of a process for detecting a voltage for a planar sensor array is depicted in accordance with an illustrative embodiment. The process illustrated in FIG. 11 can be implemented in navigation system 206 in using velocity sensor 204 in FIG. 2.

As depicted, the process begins by detecting a voltage for a planar sensor array while the planar sensor array is moving though a magnetic field, wherein the planar sensor array comprises conductive channels formed in a substrate, wherein the conductive channels are connected in series, and wherein the voltage is generated by the planar sensor array in response to a movement of the planar sensor array through the magnetic field, and wherein the voltage is proportional to a velocity of the planar sensor array moving through the magnetic field (operation 1100). The process determines the velocity of the planar sensor array using the voltage detected for the conductive channels (operation 1102). The process terminates thereafter.

Figure 12:
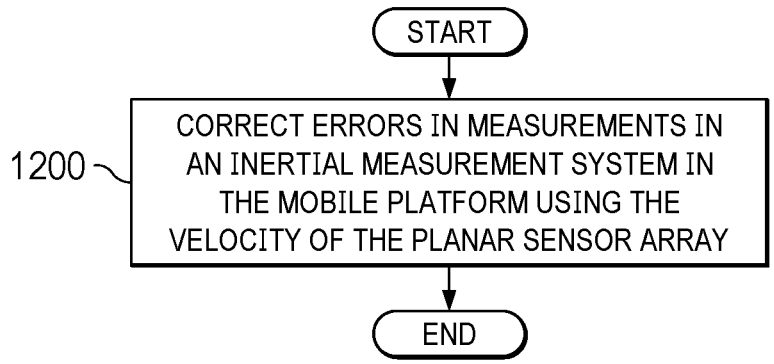
FIG. 12 is an illustration of a flowchart of a process for correcting errors in measurements in an inertial measurement system in accordance with an illustrative embodiment.

With reference to FIG. 12, an illustration of a flowchart of a process for correcting errors in measurements in an inertial measurement system is depicted in accordance with an illustrative embodiment. The process illustrated in FIG. 12 is an example of an operation that can be performed within the operations in FIG. 11.

The process corrects errors in measurements in an inertial measurement system in the mobile platform using the velocity of the planar sensor array (operation 1200). The process terminates thereafter.

Figure 13:
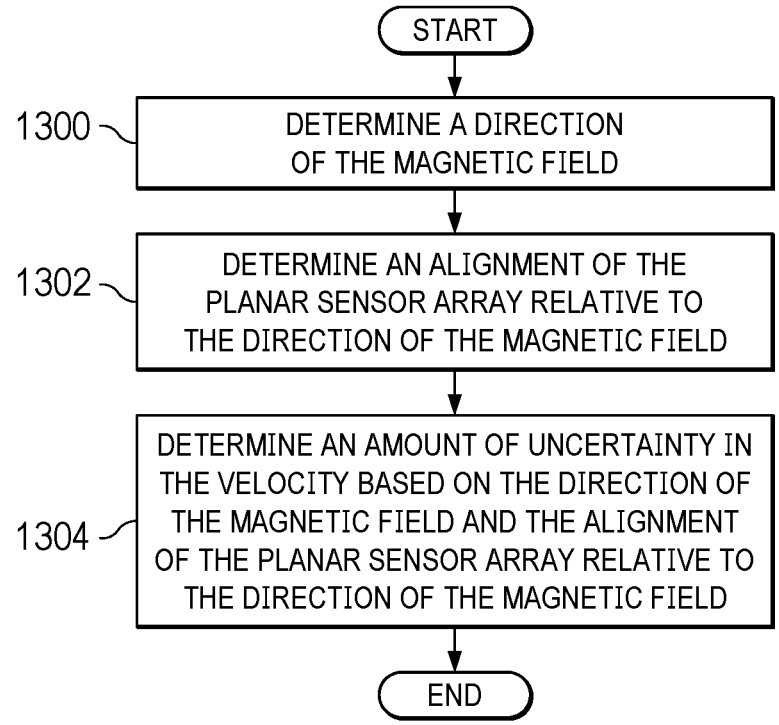
FIG. 13 is an illustration of a flowchart of a process for determining an amount of uncertainty in a velocity in accordance with an illustrative embodiment.

With reference to FIG. 13, an illustration of a flowchart of a process for determining an amount of uncertainty in a velocity is depicted in accordance with an illustrative embodiment. The process illustrated in FIG. 13 is an example of an operation that can be performed within the operations in FIG. 11.

In this illustrative example, the planar sensor array has conductive channels that lie on a plane and have lengths aligned to an axis. As the magnetic field has a direction becomes closer to being is parallel to the axis for the planar sensor array, voltage becomes smaller and when the direction of magnetic field is parallel to the planar sensor array, the voltage is the smallest.

The process begins by determining a direction of the magnetic field (operation 1300). The process determines an alignment of the planar sensor array relative to the direction of the magnetic field (operation 1302). The process determines an amount of uncertainty in the velocity based on the direction of the magnetic field and the alignment of the planar sensor array relative to the direction of the magnetic field (operation 1304). The process terminates thereafter.

As the voltage decreases because the direction of the magnetic field approaches becoming parallel to the axis for the planar sensor array, the uncertainty in determining the velocity increases. At some point, the uncertainly can be large enough such that the voltage reading is no longer considered reliable for use in determining the velocity of the velocity sensor. The uncertainty can be based on alignment of the direction of the magnetic field relative to the axis for the planar sensor array. As the alignment of the direction of the magnetic field comes closer to being parallel to the axis, the uncertainty increases.

Figure 14:
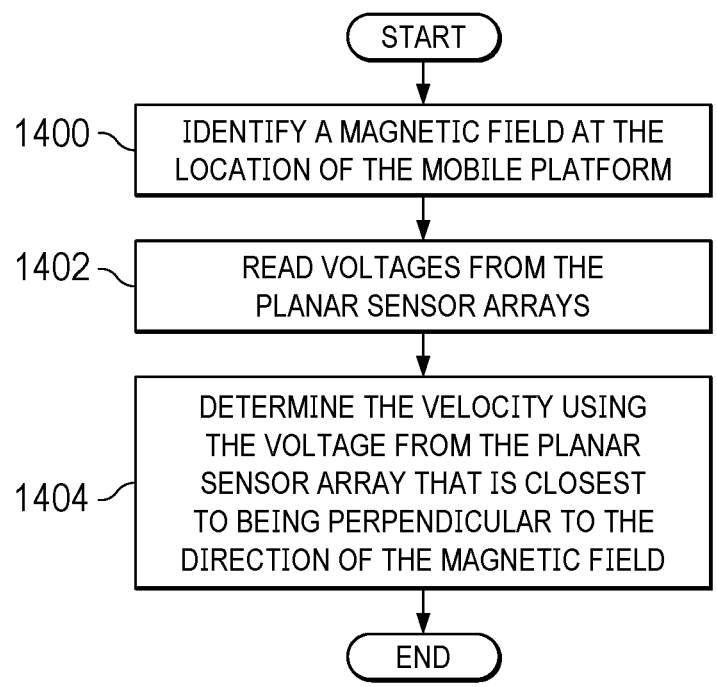
FIG. 14 is an illustration of a block diagram of a data processing system in accordance with an illustrative embodiment.

Turning next to FIG. 14, an illustration of a flowchart of a process for determining a velocity of a platform is depicted in accordance with an illustrative embodiment. The process in FIG. 14 can be implemented in hardware, software, or both. When implemented in software, the process can take the form of program code that is run by one of more processor units located in one or more hardware devices in one or more computer systems. For example, the process can be implemented in computer system 226 located in navigation system 206 in mobile platform 208 in FIG. 2. The process can be performed using velocity sensor 204. In which velocity sensor 204 has planar sensor arrays arranged relative to each other about planes defined by axes such as a coordinate access system. In one illustrative example, three planar sensor arrays can be present in which the planar sensor arrays are arranged orthogonally to each other. In other illustrative examples, other numbers of planar sensor arrays can be used in other angles rather than being at 90 degrees or orthogonal.

The process begins by identifying a magnetic field at the location of the mobile platform (operation 1400). In operation 1400, the magnitude and direction of the magnetic field are identified. The magnitude and direction of the magnetic field can be determined using a magnetometer. The location can be identified more specifically with respect to the location of the velocity sensor or as close as possible to the velocity sensor.

The process reads voltages from the planar sensor arrays (operation 1402). In operation 1402, the voltages are proportional to the velocity of the mobile platform. These different voltages can be used to determine the magnitude and direction for the velocity of the mobile platform.

The voltage reading from a planar sensor array is greatest when the direction of the magnetic field is perpendicular to the planar sensor array. Thus, measurement of velocity is for the axis on a plane that is perpendicular to the magnetic field. With 3 planar sensor arrays arranged orthogonally to each other, velocity measurements can be made for axes such an x-axis, a y-axis, and a z-axis when the direction of the magnetic field is perpendicular to those axes. In this example, the planar sensor array for an axis has the length of the conductive channels in the planar sensor array aligned with the axis.

As a planar sensor array changes relative to the direction of the magnetic field such that the direction of the magnetic field becomes closer to being parallel the axis for planar sensor array, voltage becomes smaller for the same velocity.

When the direction of magnetic field is parallel to the axis for planar sensor array, the voltage reaches zero because no sensitivity to the magnetic field is present. As the voltage decreases, because the direction of the magnetic field approaches becoming parallel to the axis for the planar sensor array, the uncertainty in determining the velocity increases. At some point, uncertainly can be so great such that the voltage reading is no longer considered reliable for use.

The process determines the velocity using the voltage from the planar sensor array that is closest to being perpendicular to the direction of the magnetic field (operation 1404). The process terminates thereafter.

In another example, the readings from the planar sensor arrays and the measurement of the magnitude and direction of the magnetic field can be used to determine a three dimensional direction of the velocity when the movement of the mobile platform is out of plane from the planar sensor arrays.

The flowcharts and block diagrams in the different depicted embodiments illustrate the architecture, functionality, and operation of some possible implementations of apparatuses and methods in an illustrative embodiment. In this regard, each block in the flowcharts or block diagrams can represent at least one of a module, a segment, a function, or a portion of an operation or step.

In some alternative implementations of an illustrative embodiment, the function or functions noted in the blocks may occur out of the order noted in the figures. For example, in some cases, two blocks shown in succession may be performed substantially concurrently, or the blocks may sometimes be performed in the reverse order, depending upon the functionality involved. Also, other blocks may be added in addition to the illustrated blocks in a flowchart or block diagram.

The operations in the flowcharts can be implemented in at least one of system, a method, or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Some features of the illustrative examples are described in the following clauses. These clauses are examples of features and are not intended to limit other illustrative examples.

Clause 1

A navigation system comprising:
a substrate, wherein the substrate is planar; and
conductive channels formed in the substrate, wherein the conductive channels are connected in series to form a planar sensor array and wherein a voltage is generated by the planar sensor array in response to a movement of the planar sensor array through a magnetic field and wherein the voltage is proportional to a velocity of the planar sensor array moving through the magnetic field.

Clause 2

The navigation system according to clause 1, wherein the conductive channels are arranged in columns in the substrate further comprising:
differential amplifiers connected to the columns of the conductive channels, wherein each differential amplifier in the differential amplifiers has a first input connected to a first conductive channel in a column and a second input connected to a last conductive channel in the column, wherein the differential amplifier has an output that outputs a difference between a first voltage at the first conductive channel and a second voltage and the last conductive channel.

Clause 3

The navigation system according to one of clauses 1 or 2, wherein the conductive channels are arranged in columns in the substrate further comprising:
a differential amplifier connected to the columns of the conductive channels, wherein the differential amplifier has a first input connected to a first conductive channel in a first column and a second input connected to a last conductive channel in a last column, wherein the differential amplifier has an output that outputs a difference between a first voltage at the first conductive channel and a second voltage at the last conductive channel.

Clause 4

The navigation system according to one of clauses 1, 2, or 3, wherein the planar sensor array is a first planar sensor array with a first input velocity axis in a first direction and further comprising:
second conductive channels for a second planar sensor array with a second input velocity axis in a second direction that is an opposite direction of the first direction for the first input velocity axis, wherein a differential voltage between the first planar sensor array and the second planar sensor array is proportional to the velocity and rejects a source of bias noise that affects both the first planar sensor array and the second planar sensor array at a same time.

Clause 5

The navigation system according to one of clauses 1, 2, 3, or 4, further comprising:
second conductive channels for a set of planar sensor arrays that generate a set of voltages in response to the movement of the set of planar sensor arrays through the magnetic field and wherein the set of voltages is proportional to the velocity of the set of planar sensor arrays moving through the magnetic field.

Clause 6

The navigation system according to clause 5, wherein the planar sensor array and the set of planar sensor arrays are positioned orthogonal to each other.

Clause 7

The navigation system according to clause 6, wherein each of the conductive channels and the second conductive channels have a width and a length;
  wherein the planar sensor array is a first planar sensor array and the set of planar sensor arrays comprises a second planar sensor array and a third planar sensor array; and
  wherein the length of the conductive channels in the first planar sensor array are aligned with an x-axis, the length of the second conductive channels in the second planar sensor array are aligned with a y-axis, and the length of the second conductive channels in the third planar sensor array are aligned with a z-axis.

Clause 8

The navigation system according to one of clauses 1, 2, 3, 4, 5, 6, or 7 further comprising:
  an inertial measurement system, wherein the velocity measured using the planar sensor array is used to correct errors in measurements in the inertial measurement system.

Clause 9

The navigation system according to one of clauses 1, 2, 3, 4, 5, 6, 7, or 8, wherein the velocity is calculated as follows:

$$v = V/NWB$$

where v is the velocity, N is a number of conductive channels in the conductive channels, W is a width of the conductive channels, B is the magnetic field, and V is the voltage.

Clause 10

The navigation system according to one of clauses 1, 2, 3, 4, 5, 6, 7, 8, or 9, wherein each conductive channel has a width and a length, wherein the length has a value where the length has no effect of the voltage measured across the conductive channels.

Clause 11

The navigation system according to one of clauses 1, 2, 3, 4, 5, 6, 7, 8, 9, or 10, wherein the magnetic field is for Earth.

Clause 12

The navigation system according to one of clauses 1, 2, 3, 4, 5, 6, 7, 8, 9, 10, or 11, wherein the substrate is a semiconductor having a room temperature mobility of at least 1,000 cm2/V*s.

Clause 13

The navigation system according to one of clauses 1, 2, 3, 4, 5, 6, 7, 8, 9, 10, 11, or 12, wherein the substrate is one of silicon, a category III-V compound, a silicon on insulator wafer, indium arsenide, gallium nitride, or gallium arsenide.

Clause 14

The navigation system according to one of clauses 1, 2, 3, 4, 5, 6, 7, 8, 9, 10, 11, 12, or 13, wherein the planar sensor array is located in a mobile platform and wherein the velocity for the planar sensor array is for the mobile platform, wherein the mobile platform is selected from a group comprising a vehicle, a mobile underwater vehicle, a submarine, a submersible vehicle, an autonomous underwater vehicle, an underwater drone, an underwater remotely operated vehicle, an aircraft, a commercial airplane, a tilt-rotor aircraft, a tilt wing aircraft, a vertical takeoff and landing aircraft, an electrical vertical takeoff and landing vehicle, a personal air vehicle, a missile, a surface ship, a boat, a tank, a personnel carrier, a train, a spacecraft, a satellite, a bus, and an automobile.

Clause 15

A velocity sensor comprising:
  a substrate, wherein the substrate is planar and has free charge carriers; and
  conductive channels formed in the substrate, wherein ends for lengths of the conductive channels are grounded and sides of the conductive channels are connected in series to form a planar sensor array and wherein a voltage is generated by the planar sensor array in response to a movement of the planar sensor array through a magnetic field and wherein the voltage is proportional to a velocity of the planar sensor array moving through the magnetic field.

Clause 16

The velocity sensor according to clause 15, wherein the conductive channels are arranged in columns in the substrate further comprising:
  differential amplifiers connected to the columns of the conductive channels, wherein each differential amplifier in the differential amplifiers has a first input connected to a first conductive channel in a column and a second input connected to a last conductive channel in the column, wherein the differential amplifier has an output that outputs a difference between a first voltage at the first conductive channel and a second voltage and the last conductive channel.

Clause 17

The velocity sensor according to one of clauses 15 or 16, wherein the conductive channels are arranged in columns in the substrate further comprising:
  a differential amplifier connected to the columns of the conductive channels, wherein the differential amplifier has a first input connected to a first conductive channel in a first column and a second input connected to a last conductive channel in a last column, wherein the differential amplifier has an output that outputs a difference between a first voltage at the first conductive channel and a second voltage and the last conductive channel.

Clause 18

The velocity sensor according to one of clauses 15, 16, or 17, wherein the planar sensor array is a first planar sensor array with a first input velocity axis and further comprising:
  second conductive channels for a second planar sensor array with a second input velocity axis that is an opposite direction of the first input velocity axis;
  wherein a differential voltage between the first planar sensor array and the second planar sensor array is proportional to the velocity and rejects a source of bias noise that affects both the first planar sensor array and the second planar sensor array at a same time.

Clause 19

A method for determining a velocity, the method comprising:
  detecting a voltage for a planar sensor array while the planar sensor array is moving though a magnetic field, wherein the planar sensor array comprises conductive channels formed in a substrate, wherein the conductive channels are connected in series, and wherein the voltage is generated by the planar sensor array in response to a movement of the planar sensor array through the magnetic field and wherein the voltage is proportional to the velocity of the planar sensor array moving through the magnetic field; and determining the velocity of the planar sensor array using the voltage detected for the conductive channels.

Clause 20

The method according to clause 19, wherein a velocity of a mobile platform in which the planar sensor array is located is the velocity of the planar sensor array.

Clause 21

The method according to one of clauses 19 or 20, wherein the planar sensor array is located in a mobile platform and further comprising:
  correcting errors in measurements in an inertial measurement system in the mobile platform using the velocity of the planar sensor array.

Clause 22

The method according to one of clauses 19, 20, or 21 further comprising:
  determining a direction of the magnetic field;
  determining an alignment of the planar sensor array relative to the direction of the magnetic field; and
  determining an amount of uncertainty in the velocity based on the direction of the magnetic field and the alignment of the planar sensor array relative to the direction of the magnetic field.

Clause 23

The method according to one of clauses 19, 20, 21, or 22, wherein the conductive channels are arranged in columns in the substrate and wherein a differential amplifier is connected to the columns of conductive channels;
  wherein the differential amplifier has a first input connected to a first conductive channel in a first column and a second input connected to a last conductive channel in a last column; and
  wherein the differential amplifier has an output that outputs a difference between a first voltage at the first conductive channel and a second voltage at the last conductive channel.

Clause 24

The method according to one of clauses 19, 20, 21, 22, or 23, wherein the planar sensor array is a first planar sensor array with a first input velocity axis;
  wherein second conductive channels for a second planar sensor array with a second input velocity axis that is an opposite direction of the first input velocity axis; and
  wherein a differential voltage between the first planar sensor array and the second planar sensor array is proportional to the velocity and rejects a source of bias noise that affects both the first planar sensor array and the second planar sensor array at a same time.

Thus, the illustrative examples provide a method, system, apparatus, and computer program product for measuring velocity of a mobile platform.

In the illustrative examples, the velocity sensor can be implemented in a semiconductor without moving parts. In the illustrative examples, the conductive channels formed in the semiconductor generate current in response to movement of the conductive channels through a magnetic field. This magnetic field is from a source not located in the mobile platform. In the illustrative example, the magnetic field is the Earth's magnetic field.

Further, the voltage is generated by the velocity sensor in response to movement through the magnetic field and not through applying a current to the conductive channels. In the illustrative examples, movement of the conductive channels through the magnetic field causes charges in the conductive channels to move, resulting in a generation of current that has a voltage that can be measured.

The description of the different illustrative embodiments has been presented for purposes of illustration and description and is not intended to be exhaustive or limited to the embodiments in the form disclosed. The different illustrative examples describe components that perform actions or operations. In an illustrative embodiment, a component can be configured to perform the action or operation described. For example, the component can have a configuration or design for a structure that provides the component an ability to perform the action or operation that is described in the illustrative examples as being performed by the component. Further, To the extent that terms "includes", "including", "has", "contains", and variants thereof are used herein, such terms are intended to be inclusive in a manner similar to the term "comprises" as an open transition word without precluding any additional or other elements.

Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A navigation system comprising:
  a substrate, wherein the substrate is planar; and
  conductive channels formed in the substrate, wherein the conductive channels are connected in series to form a planar sensor array and wherein a voltage is generated by the planar sensor array in response to a movement of the planar sensor array through a magnetic field and wherein the voltage is proportional to a velocity of the planar sensor array moving through the magnetic field.

2. The navigation system of claim 1, wherein the conductive channels are arranged in columns in the substrate further comprising:
  differential amplifiers connected to the columns of the conductive channels, wherein each differential amplifier in the differential amplifiers has a first input connected to a first conductive channel in a column and a second input connected to a last conductive channel in the column, wherein the differential amplifier has an output that outputs a difference between a first voltage at the first conductive channel and a second voltage at the last conductive channel.

3. The navigation system of claim 1, wherein the conductive channels are arranged in columns in the substrate further comprising:
  a differential amplifier connected to the columns of the conductive channels, wherein the differential amplifier has a first input connected to a first conductive channel in a first column and a second input connected to a last conductive channel in a last column, wherein the differential amplifier has an output that outputs a difference between a first voltage at the first conductive channel and a second voltage at the last conductive channel.

4. The navigation system of claim 1, wherein the planar sensor array is a first planar sensor array with a first input velocity axis in a first direction and further comprising:
  second conductive channels for a second planar sensor array with a second input velocity axis in a second direction that is an opposite direction of the first direction for the first input velocity axis, wherein a differential voltage between the first planar sensor array and the second planar sensor array is proportional to the velocity and rejects a source of bias noise that affects both the first planar sensor array and the second planar sensor array at a same time.

5. The navigation system of claim 1, further comprising:
second conductive channels for a set of planar sensor arrays that generate a set of voltages in response to the movement of the set of planar sensor arrays through the magnetic field and wherein the set of voltages is proportional to the velocity of the set of planar sensor arrays moving through the magnetic field.

6. The navigation system of claim 5, wherein the planar sensor array and the set of planar sensor arrays are positioned orthogonal to each other.

7. The navigation system of claim 6, wherein each of the conductive channels and the second conductive channels have a width and a length;
wherein the planar sensor array is a first planar sensor array and the set of planar sensor arrays comprises a second planar sensor array and a third planar sensor array; and
wherein the length of the conductive channels in the first planar sensor array are aligned with an x-axis, the length of the second conductive channels in the second planar sensor array are aligned with a y-axis, and the length of the second conductive channels in the third planar sensor array are aligned with a z-axis.

8. The navigation system of claim 1 further comprising:
an inertial measurement system, wherein the velocity measured using the planar sensor array is used to correct errors in measurements in the inertial measurement system.

9. The navigation system of claim 1, wherein the velocity is calculated as follows:

$$v = V/NWB$$

where v is the velocity, N is a number of conductive channels in the conductive channels, W is a width of the conductive channels, B is the magnetic field, and V is the voltage.

10. The navigation system of claim 1, wherein each conductive channel has a width and a length, wherein the length has a value where the length has no effect of the voltage measured across the conductive channels.

11. The navigation system of claim 1, wherein the magnetic field is for Earth.

12. The navigation system of claim 1, wherein the substrate is a semiconductor having a room temperature mobility of at least 1,000 cm2/V*s.

13. The navigation system of claim 1, wherein the substrate is one of silicon, a category III-V compound, a silicon on insulator wafer, indium arsenide, gallium nitride, or gallium arsenide.

14. The navigation system of claim 1, wherein the planar sensor array is located in a mobile platform and wherein the velocity for the planar sensor array is for the mobile platform, wherein the mobile platform is selected from a group comprising a vehicle, a mobile underwater vehicle, a submarine, a submersible vehicle, an autonomous underwater vehicle, an underwater drone, an underwater remotely operated vehicle, an aircraft, a commercial airplane, a tilt-rotor aircraft, a tilt wing aircraft, a vertical takeoff and landing aircraft, an electrical vertical takeoff and landing vehicle, a personal air vehicle, a missile, a surface ship, a boat, a tank, a personnel carrier, a train, a spacecraft, a satellite, a bus, and an automobile.

15. A velocity sensor comprising:
a substrate, wherein the substrate is planar and has free charge carriers; and
conductive channels formed in the substrate, wherein ends for lengths of the conductive channels are grounded and sides of the conductive channels are connected in series to form a planar sensor array and wherein a voltage is generated by the planar sensor array in response to a movement of the planar sensor array through a magnetic field and wherein the voltage is proportional to a velocity of the planar sensor array moving through the magnetic field.

16. The velocity sensor of claim 15, wherein the conductive channels are arranged in columns in the substrate further comprising:
differential amplifiers connected to the columns of the conductive channels, wherein each differential amplifier in the differential amplifiers has a first input connected to a first conductive channel in a column and a second input connected to a last conductive channel in the column, wherein the differential amplifier has an output that outputs a difference between a first voltage at the first conductive channel and a second voltage and the last conductive channel.

17. The velocity sensor of claim 15, wherein the conductive channels are arranged in columns in the substrate further comprising:
a differential amplifier connected to the columns of the conductive channels, wherein the differential amplifier has a first input connected to a first conductive channel in a first column and a second input connected to a last conductive channel in a last column, wherein the differential amplifier has an output that outputs a difference between a first voltage at the first conductive channel and a second voltage and the last conductive channel.

18. The velocity sensor of claim 15, wherein the planar sensor array is a first planar sensor array with a first input velocity axis and further comprising:
second conductive channels for a second planar sensor array with a second input velocity axis that is an opposite direction of the first input velocity axis;
wherein a differential voltage between the first planar sensor array and the second planar sensor array is proportional to the velocity and rejects a source of bias noise that affects both the first planar sensor array and the second planar sensor array at a same time.

19. A method for determining a velocity, the method comprising:
detecting a voltage for a planar sensor array while the planar sensor array is moving though a magnetic field, wherein the planar sensor array comprises conductive channels formed in a substrate, wherein the conductive channels are connected in series, and wherein the voltage is generated by the planar sensor array in response to a movement of the planar sensor array through the magnetic field and wherein the voltage is proportional to the velocity of the planar sensor array moving through the magnetic field; and
determining the velocity of the planar sensor array using the voltage detected for the conductive channels.

20. The method of claim 19, wherein a velocity of a mobile platform in which the planar sensor array is located is the velocity of the planar sensor array.

21. The method of claim 19, wherein the planar sensor array is located in a mobile platform and further comprising:
  correcting errors in measurements in an inertial measurement system in the mobile platform using the velocity of the planar sensor array.

22. The method of claim 19 further comprising:
  determining a direction of the magnetic field;
  determining an alignment of the planar sensor array relative to the direction of the magnetic field; and
  determining an amount of uncertainty in the velocity based on the direction of the magnetic field and the alignment of the planar sensor array relative to the direction of the magnetic field.

23. The method of claim 19, wherein the conductive channels are arranged in columns in the substrate and wherein a differential amplifier is connected to the columns of conductive channels;
  wherein the differential amplifier has a first input connected to a first conductive channel in a first column and a second input connected to a last conductive channel in a last column; and
  wherein the differential amplifier has an output that outputs a difference between a first voltage at the first conductive channel and a second voltage at the last conductive channel.

24. The method of claim 19, wherein the planar sensor array is a first planar sensor array with a first input velocity axis;
  wherein second conductive channels for a second planar sensor array with a second input velocity axis that is an opposite direction of the first input velocity axis; and
  wherein a differential voltage between the first planar sensor array and the second planar sensor array is proportional to the velocity and rejects a source of bias noise that affects both the first planar sensor array and the second planar sensor array at a same time.

\* \* \* \* \*